(12) United States Patent
Epstein et al.

(10) Patent No.: US 6,623,870 B1
(45) Date of Patent: *Sep. 23, 2003

(54) ELECTROLUMINESCENCE IN LIGHT EMITTING POLYMERS FEATURING DEAGGREGATED POLYMERS

(75) Inventors: Arthur J. Epstein, Bexley, OH (US); Yunzhang Wang, Columbus, OH (US); Darren D. Gebler, Columbus, OH (US); Timothy M. Swager, Newton, MA (US)

(73) Assignee: The Ohio State University, Columbus, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/901,888

(22) Filed: Jul. 29, 1997

Related U.S. Application Data

(60) Provisional application No. 60/023,071, filed on Aug. 2, 1996.

(51) Int. Cl.$^7$ .......................... H05B 33/14; C09K 11/06; C08G 61/12
(52) U.S. Cl. ..................... 428/690; 428/917; 313/504; 313/506; 526/265; 526/268; 526/281; 528/205; 528/211; 528/219
(58) Field of Search .................. 528/86, 205, 211, 528/219; 428/690, 917, 500, 523; 313/504, 506; 526/265, 268, 281

(56) References Cited

U.S. PATENT DOCUMENTS

| | | | |
|---|---|---|---|
| 4,356,429 A | | 10/1982 | Tang ......................... 313/503 |
| 5,247,190 A | | 9/1993 | Friend et al. ................. 254/40 |
| 5,254,633 A | | 10/1993 | Han et al. ................ 525/327.4 |
| 5,597,890 A | | 1/1997 | Jenekhe ...................... 528/397 |
| 5,712,361 A | * | 1/1998 | Stern et al. .................... 528/86 |
| 5,804,100 A | * | 9/1998 | Angelopoulos et al. ...... 252/521 |
| 5,955,834 A | * | 9/1999 | Epstein et al. .............. 313/501 |
| 6,004,681 A | * | 12/1999 | Epstein et al. .............. 428/457 |

OTHER PUBLICATIONS

Blatchford, et al., Aggregate formation in pyridine–based polymers, Mat. Res. Soc. Symp. Proc., 413(1996), pp. 671–676. (no month).
Blatchford, et al., Electronic structure of pyridine–based polymers, J. Chem, Phys., 105, pp. 9214–9226, Nov. 22, 1996.
Blatchford, et al., Photoluminescence in pyridine–based polymers: role of aggregates, Physical Review B, 54, pp. 9180–9189, Oct. 1, 1996.
Fu, et al., Alternating poly(pyridyl vinylene phenylene vinylene)s: synthesis and solid state organizations, Tetrahedron, vol. 53, No. 45 (1997), pp. 15487–15494, (no month).
Gebler, et al., Exciplex emission in heterojunctions of poly-(pyridyl vinylene phenylene vinylene)s and poly(vinyl carbazole), Synthetic Metals, 85 (1997), pp. 1205–1208, (no month).
Jessen, et al., Absorption and luminescence of pyridine–based polymers, Synthetic Metals, 84 (1997), pp. 501–506, (No month).
Partridge, Polymer, 24 (1983), pp. 733–782, (no month).
Wang, et al., Light–emitting devices based on pyridine–containing conjugated polymers, Synthetic Metals, 85 (1997), pp. 1179–1182, (no month).
Blatchford, et al., *Am. J. Phys.*, 64 (Feb. 1996) 120–135.
Blatchford, et al., *Physical Review Letters*, 76 (Feb. 1996) 1513–1515.
Blatchford, et al., *Spatially and Temporally Resolved Emission from Aggregates in Conjugated Polymers, Physical Review B*, Rapid Communication, pp. 1–14. (publication date not given).
Blatchford, et al., *Time Resolved Vibrational Spectroscopy*, (1995), 5 pages, (no month).
Blatchford, Ph.D. thesis, The Ohio State University (1996), (no month).
Brown et al., *Appl. Phys. Lett.* 61, pp. 2793–2795, Dec. 7, 1992.
Burroughes et al., *Nature*, 347, pp. 539–541, Oct. 11, 1990.
Epstein et al., *Synthetic Metals*, 78 (1996) 253–261, (no month).
Epstein, et al., *Pyridine–Based Conjugated Polymers: Photophysical Properties and Light–Emitting Devices, Macromolecular Symposia*, pp. 1–12, (publication date not given).
Epstein, et al., *Polymer Preprints*, 37 (1996) 133–134, (no month).
Gebler et al., *J. Appl. Phys.*78, pp. 4264–4266, Sep. 15, 1995.
Greenham et al. , *Nature*, 365, pp. 628–630, Oct. 14, 1993.
Grem et al., *Adv. Mater.* 4 (1992) 36–37, (no month).
Grüner et al., *Adv. Mater.* 6 (1994) 748–752, (no month).
Hu et al., *J. Appl. Phys.* 76, pp. 2419–2422, Aug. 15, 1994.
Jenekhe and Osaheni, *Science*, 265, pp. 765–768, Aug. 5, 1994.

(List continued on next page.)

Primary Examiner—Marie Yamnitzky
(74) Attorney, Agent, or Firm—Standley & Gilcrest LLP

(57) ABSTRACT

In general terms, the present invention includes a light emitting polymeric material the light emitting polymeric material capable of producing electroluminescence upon being provided with a flow of electrons, the light emitting polymeric material comprising a plurality of polymeric chains comprising polymeric chains each having substituent moieties of sufficient number and size and extending from the polymeric chain and about a substantial portion of the circumference about the polymer chain so as to maintain the polymeric chains in a sufficiently deaggregated state (referred to herein as a "strapped" polymer), so as to substantially prevent the redshifting of the electroluminescence and the lowering of light emission efficiency of the electroluminescence.

5 Claims, 5 Drawing Sheets

OTHER PUBLICATIONS

Jessen, et al., *Direct and Photoinduced Absorption in Poly(p–pyridyl vinylene): Morphological Control of Triplet Excitons and Polarons*, pp. 0–14, unpublished.

Jessen, et al., *Polymeric Material Science & Engineering*, 72 (1995) 573–574, (no month).

Jessen, et al., *Proc. Soc. of Plastics Engineers Annual Technical Conference*, (May 1996), pp. 1433–1436.

MacDiarmid, et al., *IS&T's 49th Annual Conference*, (1996) pp. 381–384, (no month).

MacDiarmid, et al., *Mat. Res. Soc. Symp. Proc.*, 413 (1996) 3–12, (no month).

MacDiarmid, et al., *Proc. Summer Topical Meetings*, (Aug. 1995), 1 page.

MacDiarmid, et al., *Proceedings Multifunctional Polymers Workshop*, (Jan–Feb. 1996), 4 pages.

MacDiarmid, et al., *Proceedings of Society of Photo–Optic Instrumentation and Engineering*, (Jul. 1995), 11 pages.

MacDiarmid, *Proc. Soc. of Plastics Engineers Annual Technical Conference*, (May 1996), pp. 1314–1317.

Ohmori et al., *Jpn. J. Appl. Phys.* 31 (1992)L568–L570, (no month).

Ohmori et al., *Sol. St. Comm.*80 (1991) 605–608. (no month).

Onoda, *J. Appl. Phys.* 78, pp. 1327–1333, Jul. 15, 1995.

Osaheni and Jenekhe, *Macromol.* 27 (1994) 739–742, (no month).

Parker et al., *Appl. Phys. Lett.* 65, pp. 1272–1274, Sep. 5, 1994.

Pope and Swenberg, *Electronic processes in organic crystals*. (Oxford University Press, New York, 1982), 739, (no month).

Quillard, et al., *Nonlinear Optics*, 10 (1995) 253–262, ( no month).

Tang and VanSlyke, *Appl. Phys. Lett.* 51, pp. 913–915, Sep. 21, 1987.

Vestweber et al., *Adv. Mater.* 4 (1992) 661–662, (no month).

Wang, et al, *SPIE—The International Society for Optical Engineering*, 2528 (Jul. 1995) 54–61.

Wang, et al., *Appl. Phys. Lett.*, 68 (Feb. 1996) 894–896.

Wang, et al., *Mat. Res. Soc. Symp. Proc.*, 413 (1996) pp. 115–118, (no month).

Wang, et al., *Polymer Preprints*, 36 (1995) 45–46, (no month).

Wang, et al., *Proc. Soc. of Plastics Engineers Annual Technical Conference*, (May 1996) 5 pages.

Wang, et al., *Synthetic Metals*, 78(1996) 33–37, (no month).

Wei, et al.,, *Journal of the American Chemical Society*, 118 (1996) 2545–2555, (no month).

Yang et al., *J. Appl. Phys.* 79, pp. 934–939, Jan. 15, 1996.

Zhang et al., *Synth. Met.* 62 (1994) 35–40, (no month).

\* cited by examiner

ELECTROLUMINESCENCE IN LIGHT EMITTING POLYMERS FEATURING DEAGGREGATED POLYMERS

This application claims the benefit of U.S. Provisional Application Ser. No. 60/023,071 filed Aug. 2, 1996.

TECHNICAL FIELD

The present invention is in the field of light-emitting polymers and light emitting devices produced therefrom.

BACKGROUND

Conjugated polymer based light-emitting devices have become an extensive area of academic and industrial research since the report of electroluminescence (EL) in poly(phenylene vinylene) (PPV) in 1990 [1].

A great number of different conjugated polymers have been found to exhibit EL including PPVs [1–3], poly (phenylphenylene vinylene) [4], polyphenylenes [5–7], polythiophenes [8–9], polyquinolines [10], polypyridines [11–12], poly(pyridyl vinylenes) [12–14] and many copolymers of these materials.

In addition to many different materials, numerous configurations have been used to change and improve device performance. For instance, the use of additional layers to improve device efficiency has been known for some time [2,15]. Inserting a hole-transport (electron blocking) layer between the anode and emitting polymer or an electron-transport (hole-blocking) layer between the cathode and emitting polymer can greatly improve efficiency by confining the majority carrier to the emitting layer. A well known hole-transport (electron blocking) layer is poly(vinyl carbazole) (PVK) which has a large band gap (3.5 eV) and is itself luminescent [16–18].

Despite these advances there remains a need for improvements in the electroluminescence performance of light emitting polymers. Particularly, there remains a need to improve the performance of exiplex-forming bilayer devices so as to reduce or eliminate the redshifting believed to be associated with the aggregation of polymeric chains within the emitting polymer.

It is a goal of the present invention to produce light emitting polymer and light emitting polymer devices made which give light emissions having reduced redshifting.

In view of the present disclosure or through practice of the present invention, other advantages may become apparent.

SUMMARY OF THE INVENTION

In general terms, the present invention includes a light emitting polymeric material the light emitting polymeric material capable of producing electroluminescence upon being provided with a flow of electrons, the light emitting polymeric material comprising a plurality of polymeric chains comprising polymeric chains each having substituent moieties of sufficient number and size and extending from the polymeric chain and about a substantial portion of the circumference about the polymer chain so as to maintain the polymeric chains in a sufficiently deaggregated state (referred to herein as a "strapped" polymer), so as to substantially prevent the redshifting of the electroluminescence and the lowering of light emission efficiency of the electroluminescence.

The electron transporting polymer may include polymeric chains selected from copolymers having the structure:

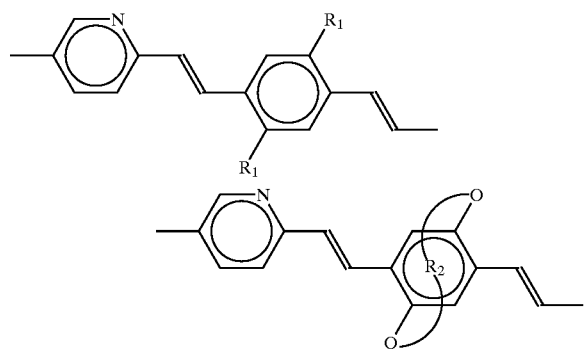

Some specific examples of polymers used in the present invention include:

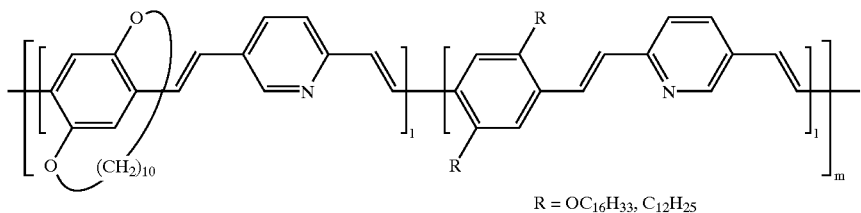

$R = OC_{16}H_{33}, C_{12}H_{25}$

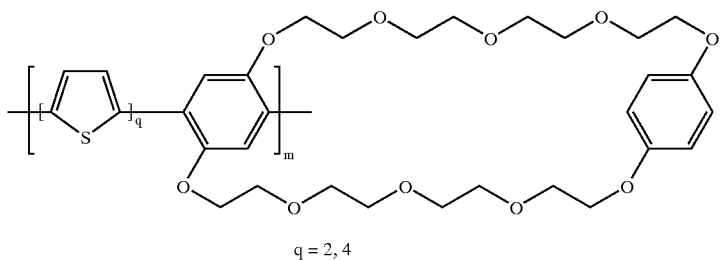

$q = 2, 4$

-continued

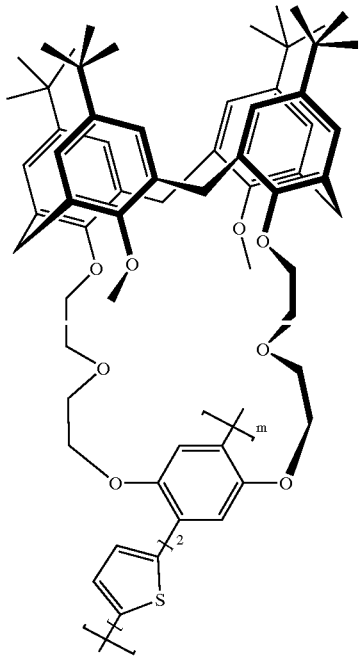

The light emitting polymeric material may also be used in single layer, bilayer or other multiple layer devices, using the polymeric material of the present invention. In the case of a single polymeric layer device, the polymeric material of the present invention may be used as the electron transporting/electron blocking layer. In the case of a bilayer or multi-layer devices, the polymeric material of the present invention may be used as the electron transporting layer in conjunction with an electron blocking layer of another appropriate polymer, such as might be selected from the group consisting of poly(vinylcarbazole).

The present invention also includes a light emitting device comprising a light emitting polymeric material according to the present invention in all of its embodiments, and a source of electrical current so as to supply the light emitting device with a flow of electrons capable of producing electroluminescence from the device.

Other examples of synthetic methods are described in reference 22 below.

These devices may be constructed in accordance with deposition and assembly techniques known in the art. The present invention may be used in the creation of a wide variety of lighting and lighted displays, giving the many advantages associated with polymeric materials.

In accordance with the present invention, results are presented for bilayer devices using PVK as a hole-transport layer and a family of copolymers of PPV and poly(pyridyl vinylene) PPyV with various side groups as the emitting layers. The absorption, photoluminescence and electroluminescence spectra indicate that the PL and EL are attributed to the formation of an exciplex at the PVK/copolymer interface for all the copolymer systems studied. An exciplex, like an excimer, is an excited state complex, except that an exciplex is formed between two different molecules (polymers in this case) rather than identical ones for an excimer [19]. Contrary to expectations, earlier reported devices do not exhibit exciplex formation. For example, Greenham et al reported a bilayer device with CN-PPV PPV, but the EL matches the PL and EL of a single CN-PPV film [3]. Results for other bilayer configurations also do not support exciplex formation [2]. Osaheni and Jenekhe [20] have observed exciplex formation in bilayers of PBO and TTA, but only for PL, although they do suggest that exciplexes may be important processes in organic light-emitting devices [20–21]. PL and EL due to exciplex formation has been reported in blends of PVK and a multiblock copolymer by Karasz and coworkers [17]), but devices with separate layers were not investigated.

DETAILED DESCRIPTION OF THE PREFERRED EMBODIMENT

In accordance with the foregoing summary of the invention, the following presents a detailed description of the preferred embodiment of the invention which is presently considered to be its best mode.

Figure 1:
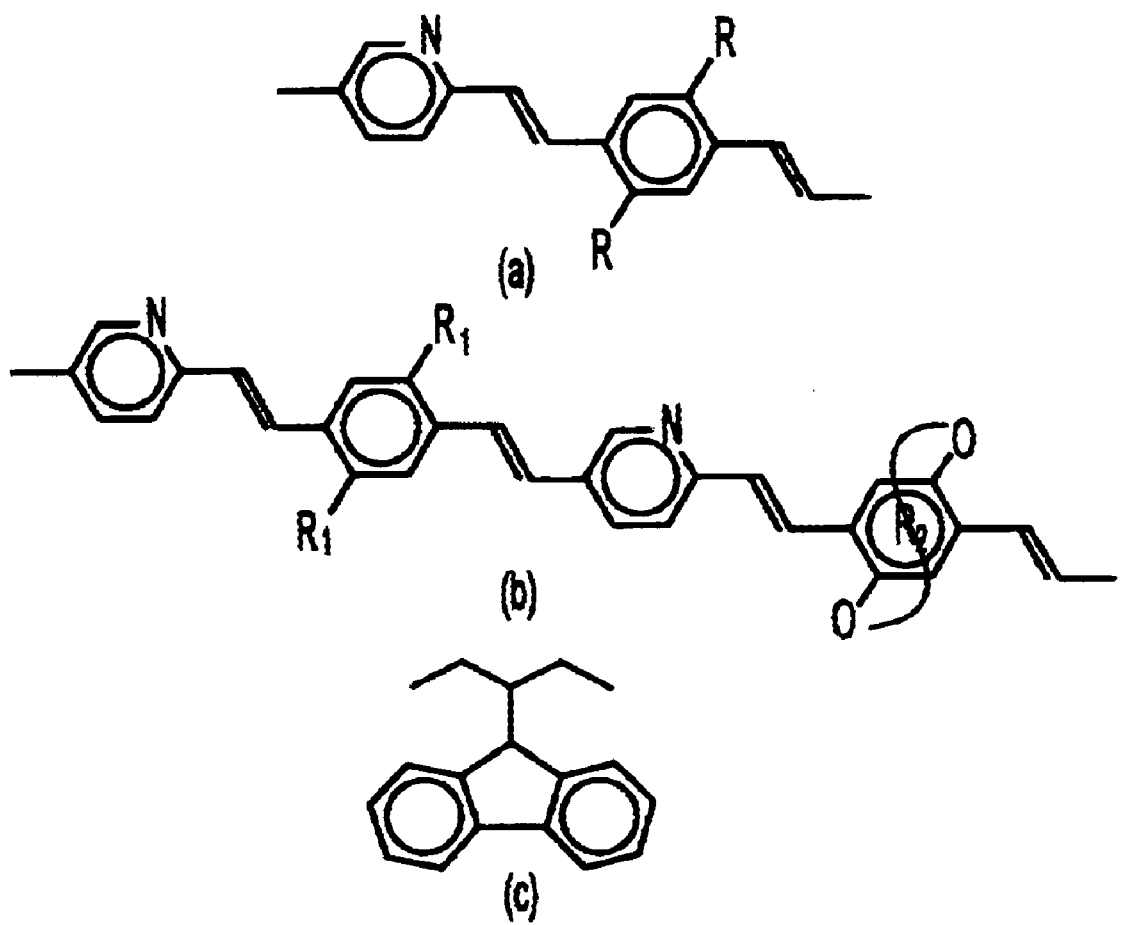
FIG. 1 depicts three chemical structures relevant to the present invention: (a) a copolymer of PPyV and PPV with side groups R=$C_{12}H_{25}$ or $COOC_{12}H_{25}$, (b) a copolymer with side group $R_1$=$OC_{16}H_{33}$ and strap $R_2$=$C_{10}H_{20}$, and (c) a hole-transport layer poly(vinyl carbazole).

The synthesis of the PPyVPV copolymers is described elsewhere [22]. FIG. 1(a) shows the molecular structure of poly(pyridyl vinylene phenylene vinylene) (PPyVPV). We report results for copolymers with side groups R=$COOC_{12}H_{25}$ and $C_{12}H_{25}$. FIG. 1(b) shows the same copolymer with a "strap" across the phenyl ring in alternate PPV segments. For the second copolymer the side groups are $R_1$=$OC_{16}H_{33}$ with a strap $R_2$=$C_{10}H_{22}$. The copolymers are soluble in common organic solvents such as tetrahydrofuran (THF), xylene, and chloroform. The PVK (FIG. 1(c)) was purchased from Aldrich Chemical Co.

The PL and EL measurements were made using a PTI QM1 luminescence spectrometer. The absorption measurements were made using a Perkin Elmer Lambda 19 UV/Vis/NIR spectrometer. The current-voltage characteristics were measured using two Keithley 195A multimeters. The voltage was applied using a FIP 6218A dc power supply. Quantum efficiency measurements were made using a calibrated QTH lamp and a United Detector Technologies Silicon Photodiode (UV-100).

The samples for PL and absorption measurements were spin cast on quartz. PVK was spin cast (~3000 rpms) from a 10 mg/ml solution in THF. The copolymers were all spin cast (~1000 rpms) from xylene (~10 mg/ml) so the underlying PVK layer was not dissolved. For devices the polymers were spin cast on indium tin-oxide (ITO) substrates, which had previously been cleaned. The PVK layer in the bilayer configurations was dried for ~30 seconds in a laminar flow hood before the copolymer layer was spin cast. All fabrication steps for the devices were conducted in an ambient atmosphere in a Class 100 cleanroom. Aluminum electrodes were thermally evaporated onto the copolymer surface at low pressures ($<10^{-6}$ torr). The active area of the devices was 7 $mm^2$.

RESULTS AND DISCUSSION

Figure 2:
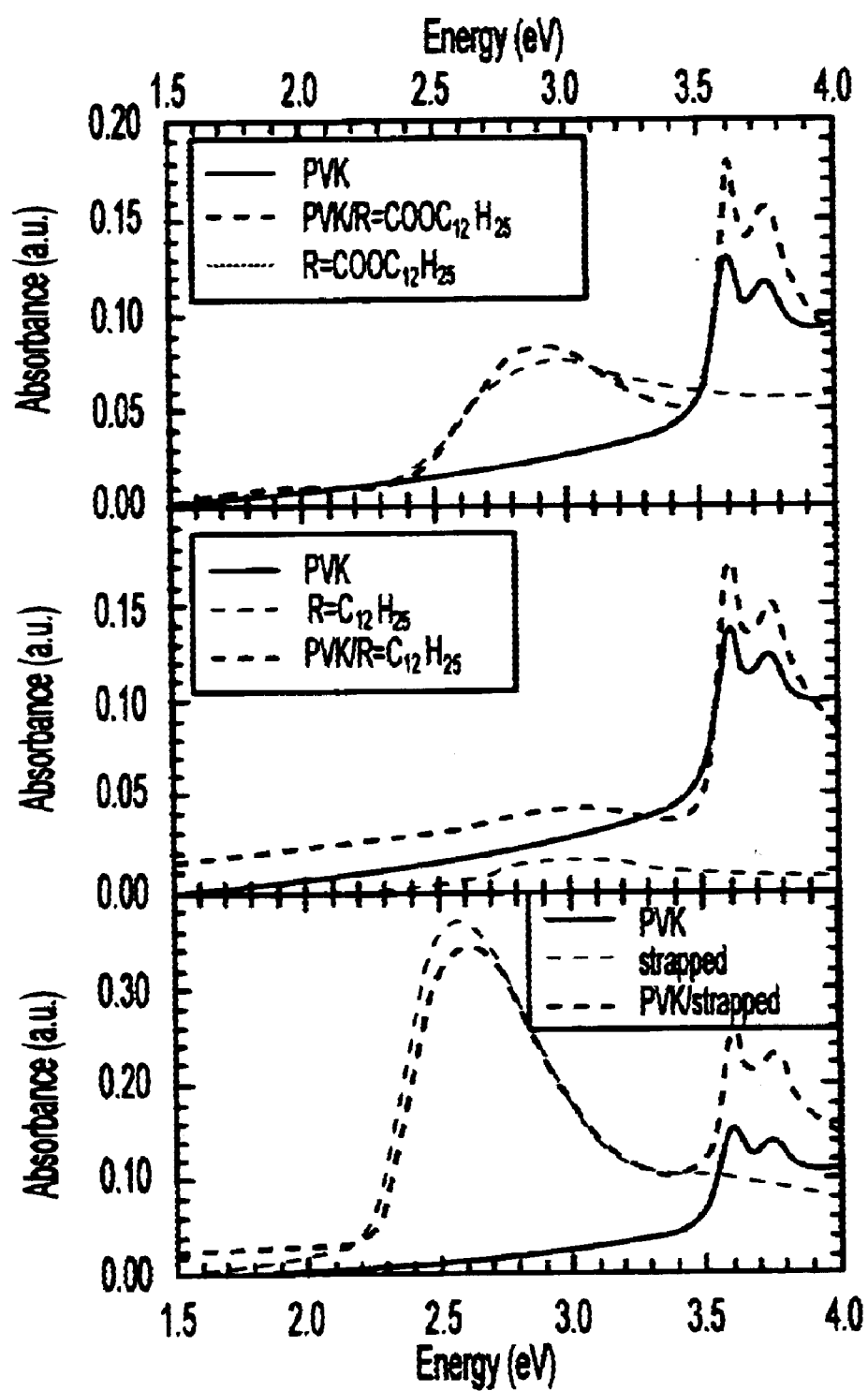
FIG. 2 depicts plots showing absorbance of a single layer of PVK, a single layer of copolymer, and a bilayer of PVK/copolymer: (a) PPyVP($COOC_{12}H_{25}$)$_2$V, (b) PPyVP ($C_{12}H_{25}$)$_2$V and (c) "strapped" copolymer.

FIG. 2 shows the absorbance for single and bilayer systems. Each of the plots shows the absorbance of a single layer of PVK, a single layer of a copolymer, and a bilayer configuration of PVK and the corresponding copolymer. The onset of PVK absorption is at 3.5 eV and shows two spectral features at 3.6 and 3.75 eV similar to previous reports [6,7]. In each of the three cases (a), (b) and (c) of FIG. 2 the absorbance of the bilayer configuration is the sum of the absorbance of each of the individual layers. No new ground to excited state transitions are present. Photoluminescence excitation (PLE) results (not shown) for each of the systems confirm these results.

Figure 3:
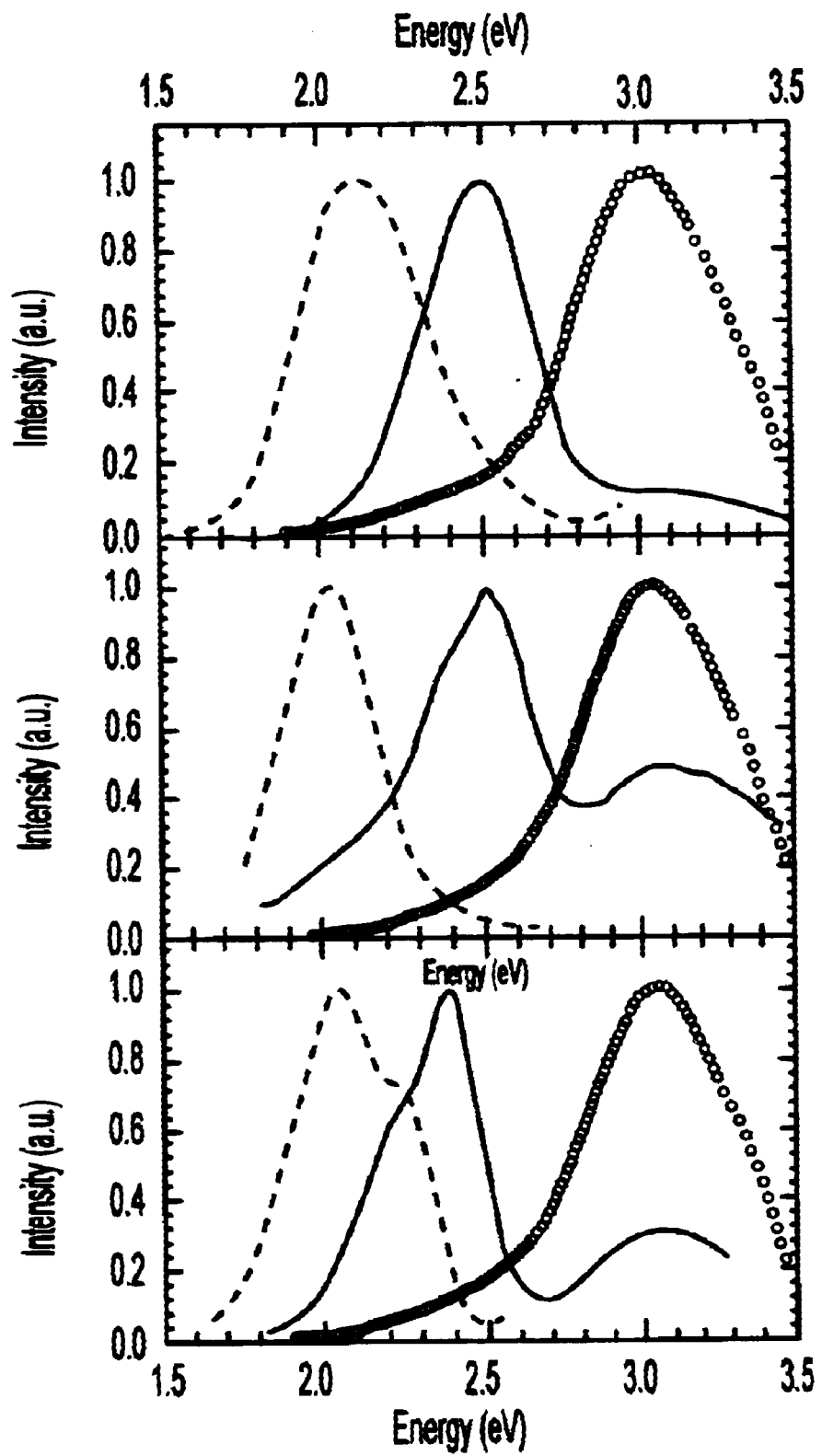
FIG. 3 shows photoluminescence of (a) PPyVP($C_{12}H_{25}$)$_2$V film (dashed line), PVK/PPyVP($C_{12}H_{25}$)$_2$V bilayer film (solid line), PVK film (○) (b) PPyVP($COOC_{12}H_{25}$)$_2$V film (dashed line), PVK/PPyVP($COOC_{12}H_{25}$)$_2$V bilayer film (solid line), PVK film (○), and (c) strapped copolymer film (dashed line), PVK/strapped copolymer bilayer film (solid line), PVK film (○).
Figure 4:
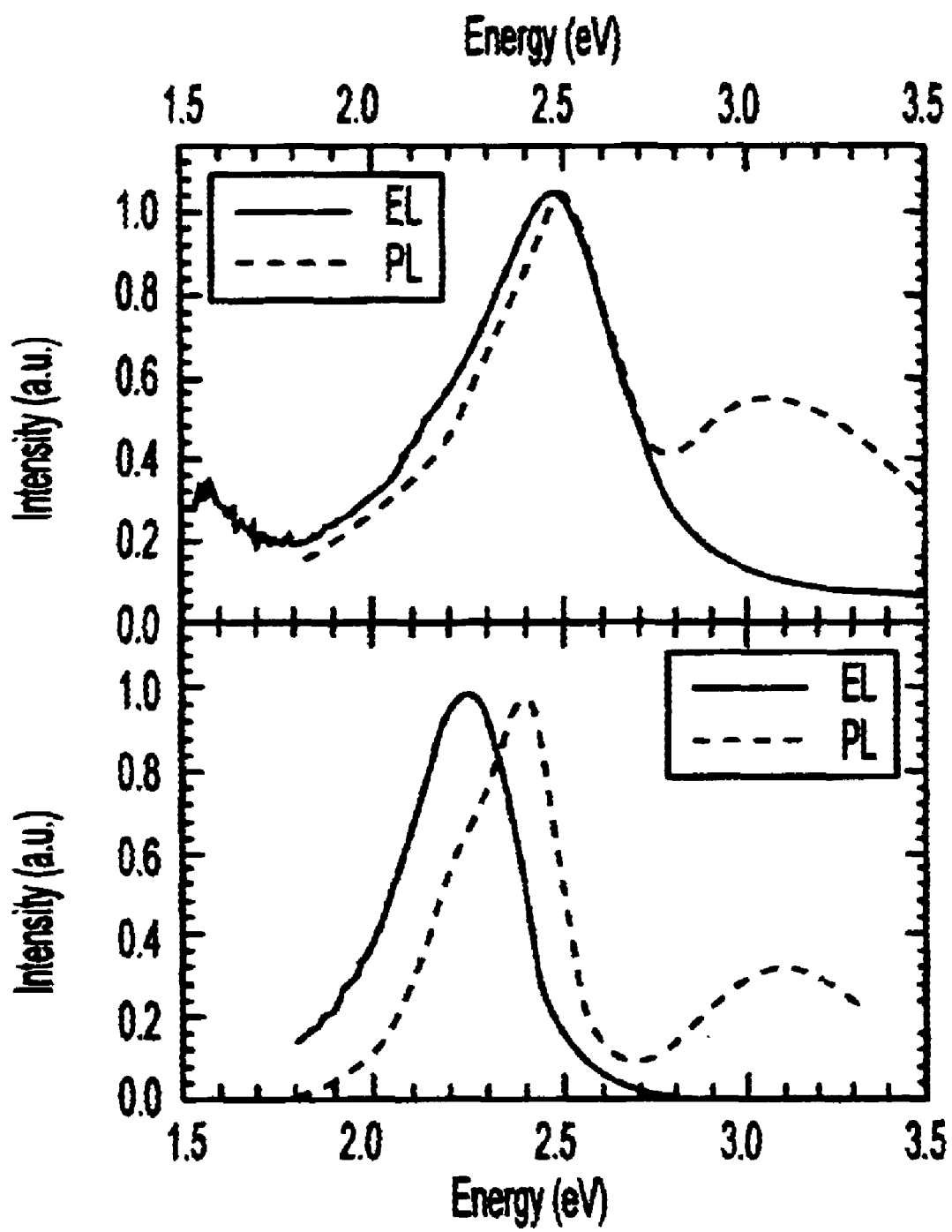
FIG. 4 shows electroluminescence (solid lines) for a (a) ITO/PVK/PPyVP($COOC_{12}H_{25}$)$_2$V/Al device and a (b) ITO/ PVK/strapped copolymer/Al device, and photoluminescence (dashed lines) for bilayer films of PVK and (a) PPyVP($COOC_{12}H_{25}$)$_2$V and (b) strapped copolymer.

The photoluminescence for the single layer and bilayer configurations are shown in FIG. 3. The PL (excited at 3.6 eV) of a PVK film is shown in FIGS. 3a, 3b and 3c by the open circles (○) and peaks at 3.05 eV similar to previous reports [6,7]. The dashed line is the PL of a single layer film of each copolymer, (a) PPyVP($C_{12}H_{25})_2$V, (b) PPyVP ($COOC_{12}H_{25})_2$V and (c) the strapped copolymer. The spectra are similar with each of the peaks at ~2.1 eV with the exception of the strapped copolymer which also has a significant shoulder at 2.25 eV. The PL of the copolymer films, which peak near 2.6 eV [23], are significantly redshifted from that of the solution PL (not shown). The PL redshift from solution to film is clue to aggregation in the copolymer films [23].

The solid lines in FIG. 3 are the PL spectra for the bilayer configurations of PVK and each of the copolymers. In each case the bilayer films were excited at 3.6 eV an energy that is greater than the band gap of PVK. In each case, more prominently in FIGS. 3b and 3c, there is PL emission at the same energy as the PVK PL emission (3.1 eV). However, the main feature in the PL of the bilayer films is located at 2.5 eV for (a) PPyVP($C_{12}H_{25})_2$V and (b) PPyVP($COOC_{12}H_{25})_2$V and at 2.4 eV for the (c) strapped copolymer. Emission at these energies is not observed for individual films of either PVK or the copolymers indicating that the emission is due to a completely different species, the exciplex. When the excitation energy is lowered below 3.4 eV (band gap of PVK) the emission due to the exciplex is drastically reduced. In addition, varying the concentration or thickness of the copolymer or PVK films in the bilayer configuration will change the relative strengths of the exciplex peak and PVK peak.

PPyVP($C_{12}H_{25})_2$V and PPyVP($COOC_{12}H_{25})_2$V have nearly identical PL results, which is expected since the side chains tend to perform the same function in both copolymers. The single layer PL results for the strapped copolymer in FIG. 3c show a completely new feature, a high energy shoulder. The high energy shoulder is closer to the solution PL and is attributed to unaggregated sites in the film. The $C_{10}H_{20}$ strap around every other phenyl ring tends to disturb the aggregation that occurs in the other copolymers of this family. The same shoulder (now on the low energy side) also appears in the bilayer film, indicating the PL has contributions from exciplex sites and from unaggregated regions of the strapped copolymer.

Figure 5:
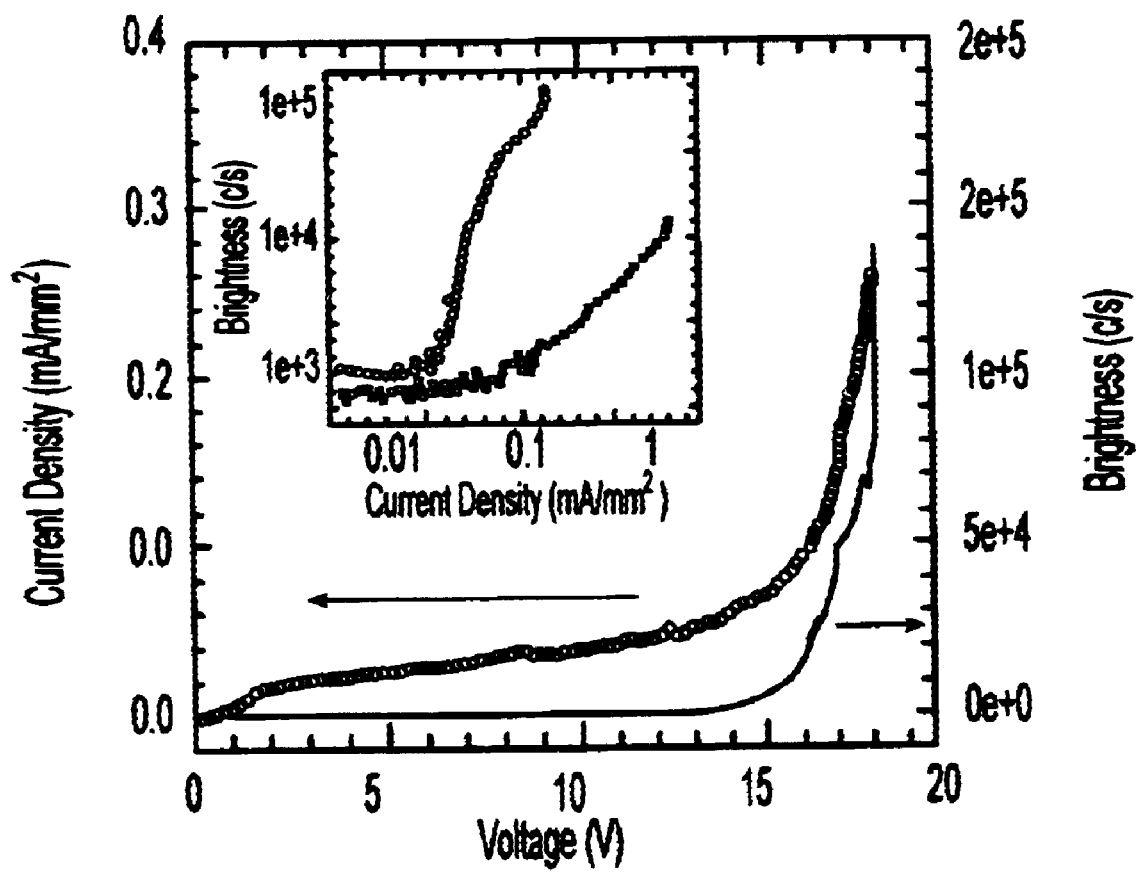
FIG. 5 shows current density-voltage characteristics (○) and brightness-voltage characteristics of an ITO/PVK/ PPyVP($COOC_{12}H_{25}$)$_2$V/Al device. Inset shows a comparison between a single layer, ITO/PPyVP($COOC_{12}H_{25}$)$_2$V/Al, device (□) and the bilayer device (○). The bilayer device is 10 times brighter at 10 times lower current density implying a 100 times improvement in efficiency.

The bilayer devices have turn-on voltages ~12–16 volts with current densities between 0.1 and 0.5 $mA/mm^2$. The devices can easily be seen in a brightly lit room and have internal quantum efficiencies ~0.1–0.5%. FIG. 5 shows the current-voltage (○) and voltage-brightness (solid line) characteristics for a typical ITO/PVK/PPyVP($COOC_{12}H_{25})_2$Vl bilayer device. The inset of FIG. 5 shows a comparison between a single layer device (ITO/PPyVP($COOC_{12}H_{25})_2$V/Al) and the bilayer device shown in the main plot. The bilayer device is ten times brighter at an order of magnitude lower current density which means the bilayer device is ~100 times more efficient than the single layer device.

In the devices the electrons are injected from the Al electrode into the conduction band of the copolymer, but they are confined at the PVK/copolymer interface due to a large barrier. The holes injected from the ITO also may be confined at the interface by a somewhat smaller barrier. The increased number of electrons and holes in the interface region increase the probability of recombination via exciplex emission. In addition the buried interface severely reduces the non-radiative recombination that otherwise will occur near the electrodes.

CONCLUSION

In summary, the present invention demonstrates the presence of exciplex emission in heterojunctions of PVK and PPyVP(R)$_2$V. The addition of a $C_{10}H_{20}$ strap on every other phenyl ring in the copolymer reduces the aggregation in the films. Emission from the strapped copolymer bilayers is a combination of light from exciplex and unaggregated sites.

The exciplex is the primary method of electroluminescence in the bilayer devices. The bilayer devices we have fabricated show a 100 times increase in efficiency compared to single layer devices due to charge confinement and exciplex emission at the interface.

The following references are hereby incorporated herein by reference:

REFERENCES

[1] J. H. Burroughes, D. D. C. Bradley, A. R. Brown, R. N. Marks, K. Mackay, R. H. Friend, P. L. Burns, & A. B. Holmes, *Nature,* 347 (1990) 539.

[2] A. R. Brown, D. D. C. Bradley, J. H. Burroughes, R. H. Friend, N. C. Greenham, P. L. Burn, A. B. Holmes, and A. Kraft, *Appl. Phys. Lett.* 61 (1992) 2793.

[3] N. C. Greenham, S. C. Moratti, D. D. C. Bradley, R. H. Friend, and A. B. Holmes, *Nature,* 365 (1993) 628.

[4] H. Vestweber ,A. Greiner, U. Lemmer, R. F. Mahrt, R. Richert, W. Heitz, and H. Bassler, *Adv. Mater.* 4 (1992) 661.

[5] G. Grem, G. Leditzky. B. Ulrich, and G. Leising, *Adv. Mater.* 4 (1992) 36.

[6] J. Gruner, P. J. Hamer, R. H. Friend, H-J. Huber, U. Scherf and A. B. Holmes, *Adv. Mater.* 6 (1994) 748.

[7] Y. Yang, Q. Pei, and A. J. Heeger, *J. Appl. Phys.* 79 (1996) 934.

[8] Y. Ohmori, M. Uchida, K. Muro, and K. Yoshino, *Sol. St. Comm.* 80 (1991) 605.

[9] Y. Ohmori, C. Morishima, M. Uchida, K. Yoshino, *Jpn. J Appl. Phys.* 31 (1992) L568.

[10] I. D. Parker, Q. Pei and M. Marrocco, *Appl. Phys. Lett.* 65 (1994) 1272.

[11] D. D. Gebler, Y. Z. Wang, J. W. Blatchford, S. W. Jessen, L-B. Lin, T. L. Gustafson, H. L. Wang, T. M. Swager, A. G. MacDiarmid, and A. J. Epstein, *J. Appl. Phys.* 78 (1995) 4264.

[12] Y. Z. Wang, D. D. Gebler, L. B. Lin, J. W. Blatchford, S. W. Jessen, H. L. Wang, A. J. Epstein, *Appl. Phys. Lett.* 68 (1996) 894.

[13] J. Tian, C-C. Wu, M. E. Thompson, J. C. Sturm, R. A. Register, *Chem. Mater.* 7 (1995) 2190.

[14] M. Onoda, *J. Appl. Phys.* 78 (1995) 1327.

[15] C. W. Tang and S. A. VanSlyke, *Appl. Phys. Lett.* 51 (1987) 913.

16 R. H. Partridge, *Polymer,* 24 (1983), pgs. 733–782.

[17] B. Hu, Z. Yang, and F. E. Karasz, *J. Appl. Phys.* 76 (1994) 2419.

[18] C. Zhang, H. von Seggern, K. Pakbaz, B. Kraabel, H-W. Scmidt and A. J. Heeger, *Synth. Met.* 62 (1994) 35.

[19] M. Pope and C. E. Swenberg, *Electronic processes in organic crystals.* (Oxford University Press, New York, 1982), 739.

[20] J. A. Osaheni and S. A. Jenekhe, *Macromol.* 27 (1994) 739.

[21] S. A. Jenekhe and J. A. Osaheni, *Science,* 265 (1994) 765.

22. Fu, et al., Alternating Poly(Pyridyl Vinylene Phenylene Vinylene)s: Sythesis and Solid State Organizations, *Tetrahedron,* Vol. 53, No. 45 (1997) pgs. 15487–15494.

[23] J. W. Blatchford, S. W. Jessen, T. M. Swager, A. G. MacDiarmid, A. J. Epstein, *Phys. Rev. B,* (1996) in press.

24. Wang, et al., Light-emitting devices based on pyridine-containing conjugated polymers, *Synthetic Metals,* 85 (1997), pgs. 1179–1182.

The contents of U.S. Provisional Patent Application Ser. No. 60/023,071 are hereby incorporated herein by reference.

In view of the present disclosure or through practice of the present invention, it will be within the ability of one of ordinary skill to make modifications to the present invention, such as through the use of equivalent arrangements and compositions, in order to practice the invention without departing from the spirit of the invention as reflected in the appended claims.

What is claimed is:

1. A light emitting polymeric film, said light emitting polymeric film capable of producing electroluminescence upon being provided with a flow of electrons, said light emitting polymeric film comprising:
a layer of a plurality of polymeric chains, wherein said polymeric chains are selected from the group consisting of copolymers having the structure:

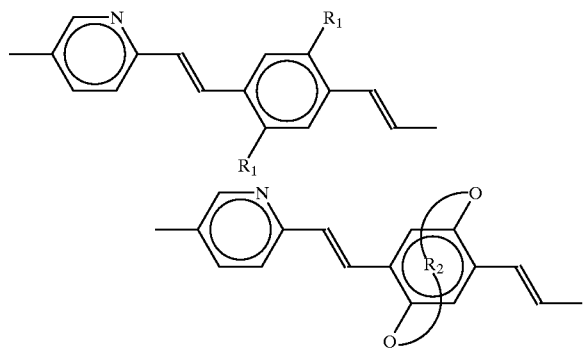

wherein $R_1$ is $OC_{16}H_{33}$ and $R_2$ is $C_{10}H_{20}$.

2. A light emitting polymeric film according to claim 1, wherein said light emitting polymeric film is further provided with a layer of an electron blocking polymer.

3. A light emitting polymeric film according to claim 1, wherein said light emitting polymeric film is further provided with a layer of an electron blocking polymer, wherein said electron blocking polymer is poly(vinylcarbazole).

4. A light emitting device, said device comprising a light emitting polymeric film according to claim 1, and a source of electrical current so as to supply said light emitting polymeric film with a flow of electrons.

5. A light emitting device, said device comprising a light emitting polymeric film according to claim 3, and a source of electrical current so as to supply said light emitting polymeric film with a flow of electrons.

* * * * *

UNITED STATES PATENT AND TRADEMARK OFFICE
CERTIFICATE OF CORRECTION

PATENT NO. : 6,623,870 B1
DATED : September 23, 2003
INVENTOR(S) : Arthur Epstein et al.

Page 1 of 1

It is certified that error appears in the above-identified patent and that said Letters Patent is hereby corrected as shown below:

Column 1,
Line 38, please delete the word "redshifiing" and replace it with the word
-- redshifting --.

Column 5,
Line 27, please delete the letters "FIP" and replace it with the letters -- HP --.

Column 6,
Line 4, please delete the word "clue" and replace it with the word -- due --.
Line 13, please delete the letters "cV" and replace it with the letters -- eV --.
Line 42, please delete the letters "VI" and replace it with the letters -- VAI --.

Signed and Sealed this

Seventeenth Day of February, 2004

JON W. DUDAS
*Acting Director of the United States Patent and Trademark Office*